US 6,657,286 B2

(12) United States Patent
Light

(10) Patent No.: US 6,657,286 B2
(45) Date of Patent: Dec. 2, 2003

(54) MICROELECTRONIC ASSEMBLY FORMATION WITH LEAD DISPLACEMENT

(75) Inventor: David Light, Los Gatos, CA (US)

(73) Assignee: Tessera, Inc., San Jose, CA (US)

( * ) Notice: Subject to any disclaimer, the term of this patent is extended or adjusted under 35 U.S.C. 154(b) by 20 days.

(21) Appl. No.: 09/957,120

(22) Filed: Sep. 20, 2001

(65) Prior Publication Data

US 2002/0072212 A1 Jun. 13, 2002

Related U.S. Application Data

(60) Provisional application No. 60/234,097, filed on Sep. 21, 2000.

(51) Int. Cl.[7] .................................. H01L 23/495
(52) U.S. Cl. ................ 257/666; 257/692; 257/695; 438/620; 438/123; 438/597
(58) Field of Search ................ 438/106, 107, 438/108, 111, 112, 124, 127, 611, 620, 597, 123, 125; 257/666, 692, 673, 674, 676, 696, 694, 695, 677

(56) References Cited

U.S. PATENT DOCUMENTS

| | | | |
|---|---|---|---|
| 4,989,069 A | * | 1/1991 | Hawkins ................ 174/524 |
| 5,148,265 A | | 9/1992 | Khandros et al. |
| 5,148,266 A | | 9/1992 | Khandros et al. |
| 5,518,964 A | | 5/1996 | DiStefano et al. |
| 5,536,909 A | | 7/1996 | DiStefano et al. |
| 5,688,716 A | | 11/1997 | DiStefano et al. |
| 5,763,941 A | | 6/1998 | Fjelstad |
| 5,798,286 A | | 8/1998 | Faraci et al. |
| 5,830,782 A | | 11/1998 | Smith et al. |
| 5,913,109 A | | 6/1999 | Distefano et al. |
| 5,915,752 A | | 6/1999 | DiStefano et al. |
| 5,976,913 A | | 11/1999 | Distefano |
| 5,989,936 A | | 11/1999 | Smith et al. |
| 6,117,694 A | | 9/2000 | Smith et al. |
| 6,221,750 B1 | | 4/2001 | Fjelstad |

FOREIGN PATENT DOCUMENTS

| WO | WO 97/11588 | 3/1997 |
|---|---|---|
| WO | WO 98/44564 | 10/1998 |

OTHER PUBLICATIONS

U.S. application Ser. No. 09/549,638.
U.S. application Ser. No. 09/271,688.
U.S. application Ser. No. 09/317,675.
U.S. application Ser. No. 09/858,770.

* cited by examiner

*Primary Examiner*—Caridad Everhart
(74) *Attorney, Agent, or Firm*—Lerner, David, Littenberg, Krumholz & Mentlik, LLP

(57) ABSTRACT

Leads are connected between first and second elements so that a first end of each lead is connected to the first element and a second end of each lead is connected to the second element. and the elements are moved away from one another so as to bend the leads towards a vertically-extensive disposition. The direction of each lead, prior to the movement step, is represented by a lead direction vector from the first end of the lead to the second end of the same lead. At least some of these lead direction vectors are non-parallel with at least some other lead direction vectors, but the various lead direction vectors have components in a common direction. During the vertical movement step, the first element is moved in a horizontal direction of motion in this common direction, thereby moving the first end of each lead horizontally toward the second end of that lead, so as to provide or maintain slack in the leads.

40 Claims, 9 Drawing Sheets

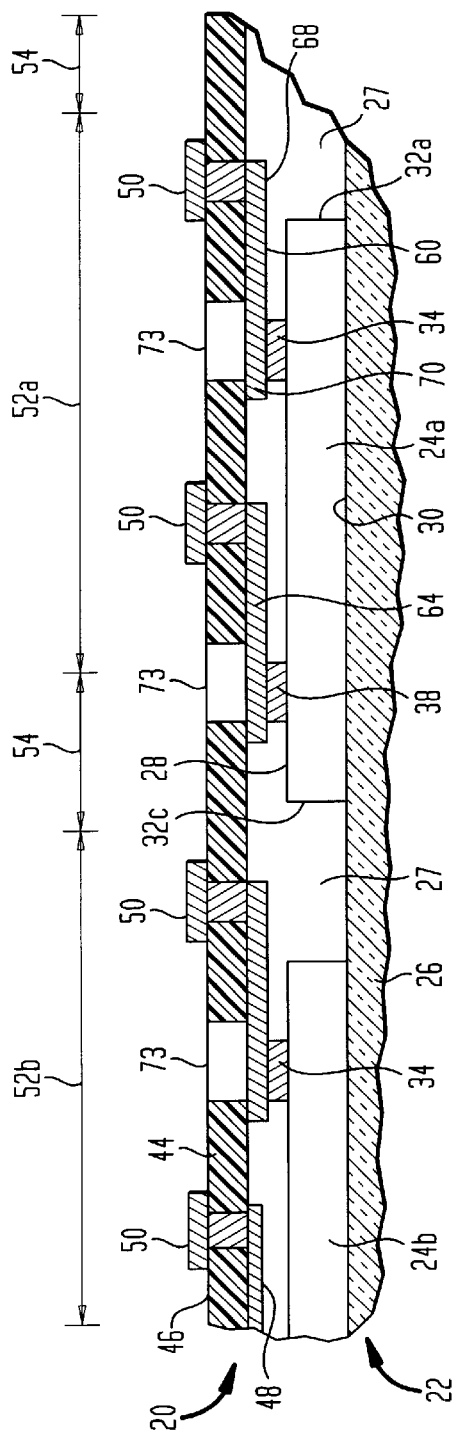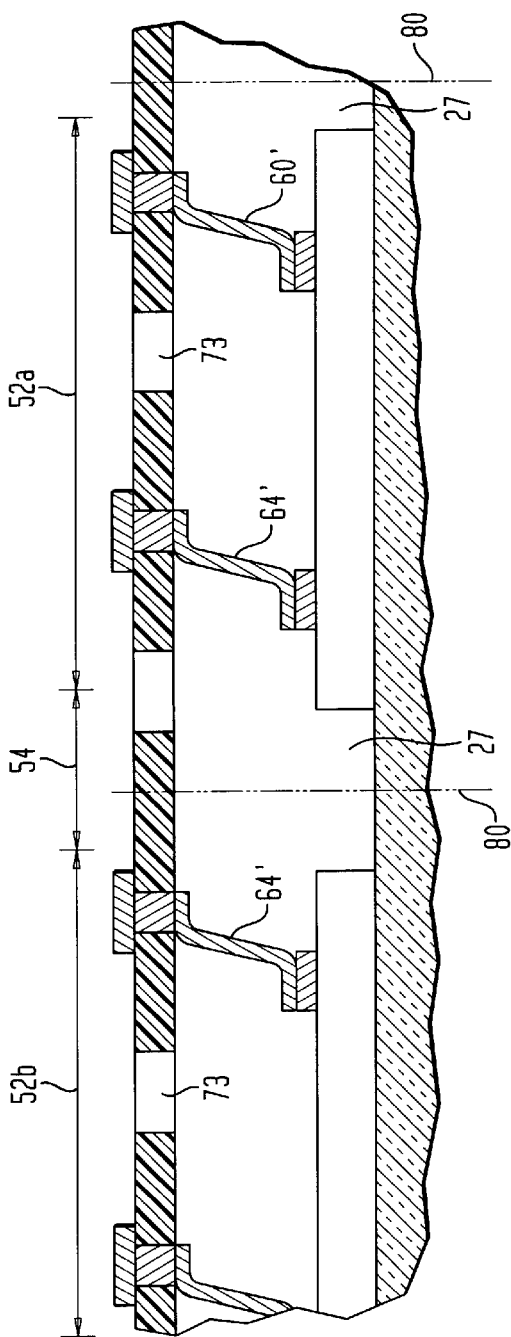

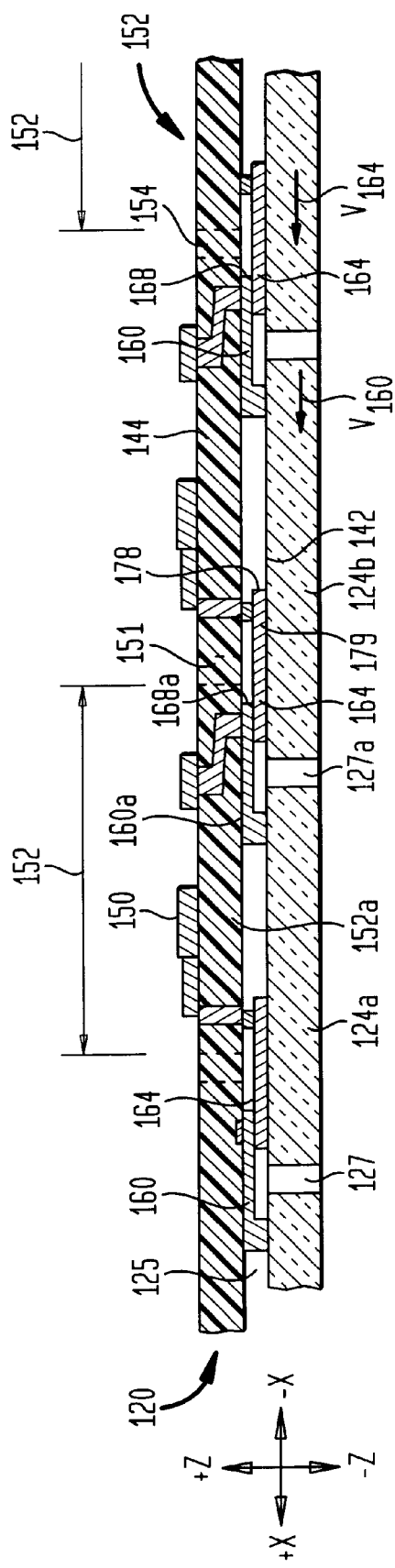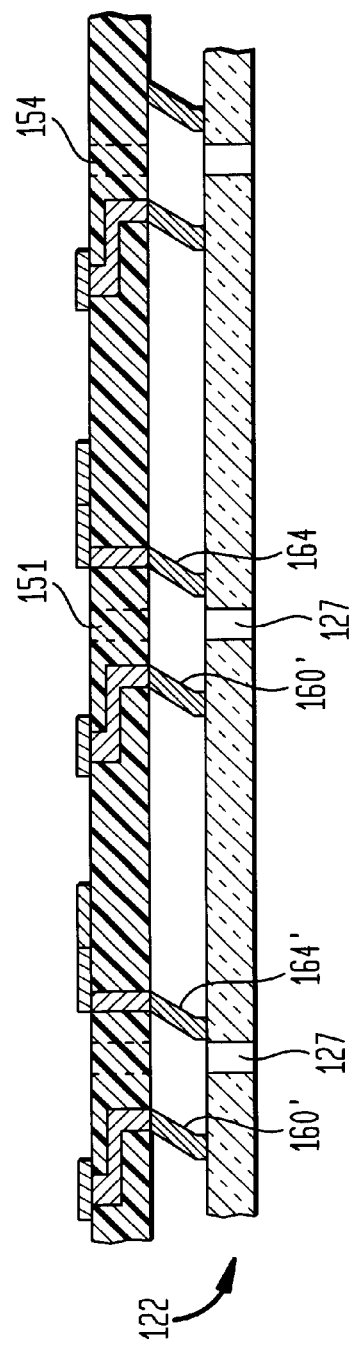

MICROELECTRONIC ASSEMBLY FORMATION WITH LEAD DISPLACEMENT

The present invention claims the benefit of U.S. Provisional Application 60/234,097 filed on Sep. 21, 2000, the disclosure of which is incorporated by reference herein.

The present invention relates to methods of making microelectronic assemblies, and to components for use in microelectronic assemblies.

BACKGROUND OF THE INVENTION

As disclosed in certain preferred embodiments of commonly assigned U.S. Pat. Nos. 5,148,265 and 5,148,266, packaged semiconductor chips desirably incorporate a semiconductor chip and flexible leads connected to the chip and extending to terminals. The terminals are movable with respect to the chip. In use, the terminals can be connected to contact pads on a circuit board or other substrate so as to connect the chip in a larger circuit. For example, the terminals may be solder-bonded to the contact pads of the substrate. Differential thermal expansion and contraction of the chip and substrate can be taken up by movement of the terminals relative to the chip. This alleviates stress on the connections between the terminals and the substrate. In certain embodiments disclosed in the aforementioned patents, the terminals are carried on a connection component such as a dielectric element. A compliant layer as, for example, a gel or an elastomer, may be disposed between the terminals and the chip, typically between the dielectric element and the chip, so as to support the terminals while leaving the terminals mechanically decoupled from the chip and free to move relative to the chip.

The connections between the chip and the terminals may be made by bending individual leads and connecting the leads to the contacts on the chip individually. As disclosed in certain preferred embodiments of commonly assigned U.S. Pat. No. 5,518,964, the disclosure of which is hereby incorporated by reference herein and a copy of which is attached hereto, numerous leads can be connected simultaneously, bent simultaneously or both. In one example of such a process, the leads and terminals are provided on a dielectric element. The leads extend along a bottom surface of the dielectric element. Each lead has a first end permanently connected to the dielectric element and a second end releasably connected to the dielectric element. By aligning the dielectric element with the chip, the second ends of all of the leads are aligned with contacts on the chip, whereupon the leads are bonded to the contacts on the chip. The bonding process may be performed so as to bond individual ends to the corresponding contacts scriatim or, preferably, so as to bond all of the second ends to the chip contacts simultaneously. After bonding the second ends of the leads, the dielectric element is moved vertically away from the chip, so as to pull the second ends of the leads away from the dielectric element and bend the leads to a vertically-extensive disposition. A fluid may be injected between the chip and the dielectric element so as to form a compliant layer between the chip and the dielectric element. In certain embodiments, the process is performed on a wafer including numerous chips disposed side-by-side. The dielectric element includes numerous regions, each associated with one chip. During the bonding step, the second ends of the leads in each region are connected to contacts on the chip associated with that region. After bonding, and typically after moving the dielectric element and chip away from one another so as to bend the leads, the wafer and the dielectric element are severed along linear severance zones referred to as "saw lanes" so as to form individual units, each including one chip and the associated region of the dielectric element, together with the terminals and flexible leads connecting the terminals to the contacts of the chip. In variants of these processes, the leads may be initially formed on the chip or wafer, rather than on the dielectric element. During assembly, the first ends of the leads are connected to conductive parts such as terminal structures or traces on the dielectric element. As disclosed, for example, in co-pending, commonly assigned U.S. patent application Ser. No. 09/317,675, the disclosure of which is hereby incorporated by reference herein, this approach is particularly advantageous where the contacts on the chip are small and closely spaced.

The processes disclosed in the '964 patent and variants thereof provide numerous advantages. In certain of these processes, the vertical movement of the dielectric element and chip displaces the first end of each lead away from the second end of the lead. This tends to stretch the leads, which would leave the leads taut in the finished assembly. It is desirable to leave some slack in the leads in the finished assembly. As disclosed in the '964 patent, two fundamental approaches have been employed to compensate for this phenomenon and provide slack in the leads. In the first such approach, sometimes referred to as "lift and shift," the dielectric element and the chip or wafer are moved horizontally relative to one another, typically at the same time as they are moved vertically away from one another. The direction of the horizontal movement is selected so that it displaces the first ends of the leads horizontally toward the second ends of the leads. Desirably, the horizontal displacement provides at least enough slack in each lead to compensate for the extension induced by the vertical displacement. In another approach, the leads are initially curved in the horizontal plane. The vertical movement causes some reduction in this curvature, but preferably does not pull the leads fully taut. Either approach can provide satisfactory compensation for the lead elongation caused by the vertical movement.

These processes can be used with chips having an "area array" contact pattern in which the contacts of the chip are substantially evenly spaced over all or most of the chip front surface, or with chips having contacts disposed in rows on a small portion of the chip front surface. Many chips have all or most of their contacts disposed in rows adjacent the edges of the chip. For example, where the chip has the conventional rectangular shape, the contacts may be disposed in rows along all four edges of the front surface, or along two opposite edges. The contacts within each row typically are disposed at small center-to-center distances or "contact pitch." As disclosed, for example, in certain embodiments of U.S. Pat. No. 5,830,782, the disclosure of which is hereby incorporated by reference herein and a copy of which is annexed hereto, leads which are initially curved prior to connection with the chip can be used. However, in some cases it would be desirable to use leads, which are initially straight with such a chip, so as to facilitate the bonding process.

SUMMARY OF THE INVENTION

A method of making a microelectronic unit according to one aspect of the invention most preferably includes the step providing first and second elements and leads extending between said elements, each said lead having a first end connected to the first element and a second end connected to the second element. The leads may be provided on either one of the elements and connected to the opposite element when the elements are united during the process. For example, when the first element is a connection component incorporating a dielectric element and the second element is a chip, assembly of chips or a wafer, the leads may be carried on the dielectric element or on the chips or wafer prior to assembly. The directions of the leads can be described with reference to a "direction vector." Each lead has a direction vector from its first end (the end connected to the first element) to its second end (the end connected to the second element). In processes according to this aspect of the invention, at least some of the direction vectors are non-parallel to others of said direction vectors. However, the direction vectors have components in a common horizontal direction. For example, the leads may be provided in rows including a first row extending in X horizontal directions and a second row extending in Y horizontal directions perpendicular to the X directions. The direction vectors of leads in the first row having components in a+Y direction, whereas the direction vectors of the leads in said second row have direction vectors in the +X direction. The direction vectors of these leads have components in a common direction oblique to the +X and +Y directions.

The method further includes the step of moving the first and second elements relative to one another so that the first element moves relative to the second element through a predetermined displacement with a vertical or Z-direction component of movement away from said second element and with a horizontal component of movement in the common horizontal direction. Where the leads have direction vectors in the +X and +Y directions, the horizontal movement has components in the +X and +Y directions. Stated another way, the first element moves through a predetermined displacement relative to the second element vertically away from the second element and horizontally oblique to the row directions and oblique to the lead direction vectors. The first element most preferably moves with a horizontal component of motion in the common direction defined by the lead direction vectors.

The vertical movement will bend the leads and displace the first end of each lead away from the second end of such lead. However, the horizontal movement will displace the first end of each lead toward the second end of such lead, so as to provide slack in the leads. This is accomplished even though the leads, prior to movement, do not all extend in the same directions. Processes according to this aspect of the invention can be used, for example, with chips having contacts disposed in rows, and can employ leads which are initially straight, such that the leads within each row are parallel to one another. This simplifies the bonding processes used to connect the leads.

The leads may include rows connected to contacts on opposite edges of a chip, and may include, for example, leads connected to rows of contacts on four edges of a rectangular chip. However, the lead direction vectors of leads on opposite edges desirably extend in the same direction. Thus, the leads direction vectors of leads on one edge point inwardly, toward the center of the chip, whereas the lead direction vectors of leads on the opposite edge point outwardly, away from the center of the chip.

A related aspect of the invention provides an article for use in making microelectronic assemblies. The article includes a dielectric element having a bottom surface and leads extending over the bottom surface of the dielectric element. The leads have first ends permanently connected to the dielectric element, and second ends releasably connected to the dielectric element. Each lead has a lead direction vector from its first end to its second end. The lead direction vectors of at least some of the leads extend in different directions, but the lead direction vectors of all of the leads have components in a common direction. Such an article may be used in processes as discussed above, by uniting the article with a microelectronic element such as a chip, wafer or assemblage of plural chip to provide the first and second elements and leads as referred to above.

Yet another aspect of the invention provides an article comprising a microelectronic element including at least one semiconductor chip, the microelectronic element having a top surface. The article further includes leads extending over the top surface of the microelectronic element. The leads have first ends releasably connected to the microelectronic element and second ends permanently connected to the microelectronic element. Here again, each lead has a lead direction vector from its first end to its second end, the lead direction vectors of at least some of said leads extending in different directions, the lead direction vectors of all of the leads having components in a common direction. Such an article may be united with a further element such as a dielectric sheet having conductive features thereon to provide the connected first and second elements used in the process as described above.

A further aspect of the invention provides additional methods of making microelectronic assemblies. Methods according to this aspect of the invention desirably include providing a first element, a second element and leads having first ends connected to the first element and second ends connected to the second element, the leads having attachment regions between their first and second ends, attachment regions of the leads extending along a surface of the first element. The first and second elements are moved relative to one another so that said first element moves vertically away from said second element through a first displacement in a +Z direction. During this step, the attachment regions of the leads are at least partially detached from the first element. Thus, the attachment regions may be peeled away from the first element as the elements move away from one another. At the conclusion of this step, the leads may be taut. Following this step, the first and second elements are moved relative to one another so that said first element moves vertically toward said second element through a second predetermined displacement in a −Z direction so as to provide slack in the leads. Methods according to this aspect of the invention can provide slack in the leads regardless of whether the leads are initially straight or curved, and regardless of the orientation of the leads. Also, no horizontal movement of the elements is required to provide slack, although horizontal movement may be employed as well.

BRIEF DESCRIPTION OF THE DRAWINGS

FIG. 2 is a diagrammatic sectional view taken along line 2—2 in FIG. 1.

FIG. 4 is a view similar to FIG. 2 but depicting the elements of FIGS. 1 and 2 at a later stage of the process.

FIG. 5 is a diagrammatic sectional view depicting the elements used a process in accordance with another embodiment of the invention during one stage of such process.

FIG. 6 is a view similar to FIG. 5 but depicting the elements of FIG. 5 at a later stage of the process.

DETAILED DESCRIPTION OF THE PREFERRED EMBODIMENTS

Figure 1:
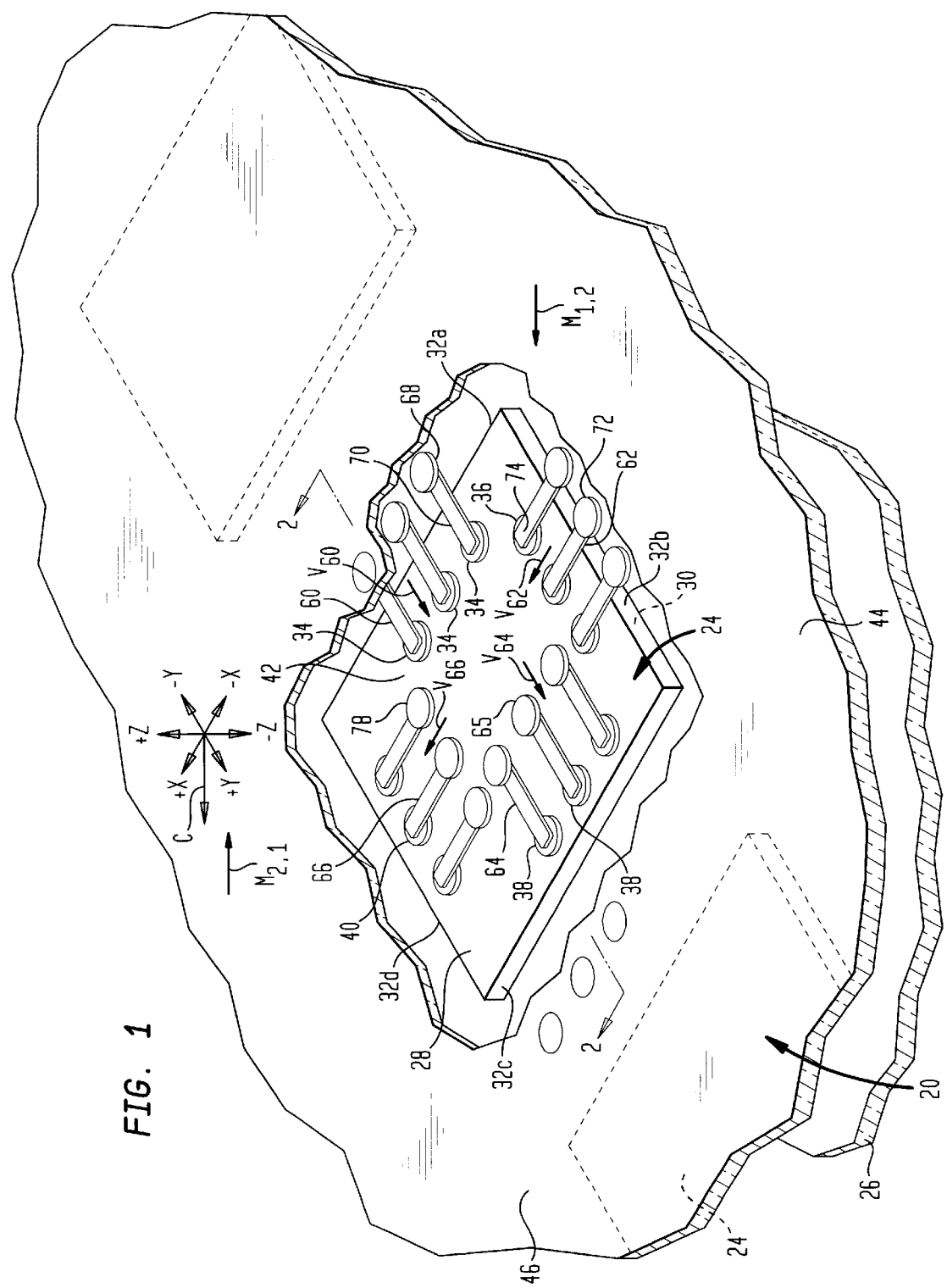
FIG. 1 is a fragmentary, diagrammatic, perspective view depicting elements during one stage of a process according to one embodiment of the invention, with portions of one element removed for clarity of illustration.

A process in accordance with one embodiment of the invention uses a first element 20 and a second element 22 incorporating a plurality of semiconductor chips 24 disposed side-by side on a temporary support 26, with gaps 27 (FIG. 2) between the chips. Each chip has a front or top surface 28, a rear surface 30 and edges extending between the front and rear surfaces and bounding the front and rear surfaces. The chips are disposed on temporary support 26 so that the front surface 28 faces upwardly away from the support and the rear surfaces 30 face downwardly toward the support. The directions used in this disclosure to describe features of the elements are depicted in FIG. 1. The "+Z" direction is the upward direction, i.e., the direction from the rear surface 30 to the front surface 28 of the chips, whereas the −Z direction is the opposite, downward direction. The term "vertical" refers to the +Z and −Z directions. The +X direction is an arbitrary direction, perpendicular to the Z directions, whereas the −X direction is opposite to the +X direction. The +Y and −Y directions are directions opposite to one another and perpendicular to the X and Z directions. The X and Y directions, and other directions in the plane defined by the X and Y directions, are referred to herein as "horizontal" directions. The horizontal directions extend generally parallel to the top surface 28 of the chips.

The particular chips illustrated in FIG. 1 have their edges 32 extending in the X and Y directions. Each chip has a first row of contacts 34 extending in the X directions adjacent to and parallel to a first edge 32a of the chip; a second row of contacts 36 extending in the Y directions, adjacent to and parallel to a second edge 32b, and third and fourth rows of contacts 38 and 40 extending in the X direction and in the Y direction, respectively, these rows being adjacent to and parallel to edges 32c and 32d, opposite from edges 32a and 32b. The top surface of the chip has an inner region 42 bounded by the rows of contacts. The contact pitch or center-to-center distance between adjacent contacts within each row typically may be about 50 microns or less, most typically about 40 to 250 microns. Chips having contacts arranged in this fashion are commonly connected to other elements by wire bonding processes.

First element 20 includes a dielectric sheet 44 having a top surface 46 facing upwardly and a bottom surface 48. Terminals 50 are disposed on sheet 44 and exposed at the top surface 46. The particular terminals 50 depicted in FIGS. 1–3 project from the top surface, but this is not essential; the terminals may be flush with the top surface or recessed within the dielectric element. Also, although the dielectric element is depicted as a solid sheet of dielectric material, the dielectric sheet may be a multi-layer structure, and may include conductive elements such as potential planes or conductors disposed on one or both surfaces or within the dielectric sheet. The dielectric sheet includes a plurality of regions, each carrying the terminals 50 which will be used with one chip 24 in the completed assembly. For example, region 52a carries the terminals 50 which will be used with one chip 24a, whereas region 52b carries the terminals 50 which will be used with another chip 24b. Thus, each region 52 will be associated with one chip in the completed assembly. The sheet also has severance zones 54 bounding regions 52 and separating these regions from one another.

Each region 52 of sheet 44 is associated with four rows of leads 60, 62, 64 and 66. In the particular structure depicted in FIGS. 1 and 2, the leads are provided on sheet 44 before the sheet is engaged with the second element. For example, the leads may be formed on the bottom surface 48 of the sheet by conventional additive processes such as plating, by conventional subtractive processes such as etching from a continuous metal layer, or the like. Each lead has one end permanently attached to the sheet and electrically connected to a terminal 50 or to other electrically conductive structures of the sheet (not shown). The opposite ends of the leads desirably are releasably connected to the sheet. Suitable releasable connections, and methods of forming the same, are described, for example, in the '964 patent; in U.S. Pat. No. 5,763,941, the disclosure of which is also incorporated by reference herein, and in co-pending, commonly-assigned U.S. patent application Ser. No. 09/020,750, filed Feb. 9, 1998, the disclosures of which is hereby incorporated by reference herein and a copies of which are annexed hereto. Merely by way of example, suitable releasable connections include small metallic or dielectric connecting elements extending from the second ends of the leads to the dielectric sheet, which can be broken when the lead is peeled away from the sheet. Alternatively or additionally, the mutually-contacting surfaces of the sheet and the second ends of the leads may be selected so that they adhere weakly to one another. Also, as disclosed, for example in U.S. Pat. Nos. 5,536,909 and 5,915,752, the disclosures of which are hereby incorporated by reference herein, the releasable ends of the leads may be connected to the sheet through frangible elements integral with the leads, and these frangible elements may be broken during connection of the leads to the chips or during subsequent steps. The particular sheet 44 depicted in FIGS. 1 and 2 has apertures or bond windows 73 (FIG. 2) aligned with the releasably connected ends of the leads, so that a tool may be inserted through windows 73 to bond the releasably connected ends of the leads to the contact on chips 28. For example, an ultrasonic or thermosonic bonding process may be used. However, as described in the patents and applications mentioned above, the bond windows can be omitted where the leads are arranged for bonding without use of a bonding tool, as, for example, where the second ends of the leads or the contacts on the chip carry a bonding material such as a solder, a eutectic bonding alloy or an electrically conductive adhesive.

In the stage of the process illustrated in FIGS. 1 and 2, the first element 20 overlies the second element 22, so that the bottom surface 48 of sheet 44 faces toward the top surfaces 28 of the chips. Each region 52 is juxtaposed with the chip 24 to be associated with that region. For example, region 52a (FIG. 2) is juxtaposed with chip 24a; region 52b is juxtaposed with chip 24b, and other regions of the sheet (not shown) are juxtaposed with other chips. Although only one region 24a and one chip 24b are described in the following passages of the specification, it should be appreciated that the same features are provided on the other chips and the regions of the sheet associated with the other chips. The first row of leads 60 is aligned with the first row of contacts 34 on the chip 24a associated with region 52a. Each lead 60 of the first row has a first end 68 permanently attached to sheet 44 of the first element 20 and has a second end 70 attached to a contact 34 of the first row on the second element 22. Each lead 60 of the first row has a lead direction vector $V_{60}$ from its first end 68 to its second end 70. The lead direction vectors $V_{60}$ point in the +Y direction, transverse to the row of contacts 34. The row of leads 60 as a whole extends in the X directions, parallel to the row of contacts 34. All of the leads 60 within the first row are straight and parallel to one another. This makes it easier to provide the leads on the sheet close to one another so as to match the close spacings between contacts 34, and makes it easier to bond the second ends 70 of the leads to the contacts. This is particularly advantageous when a bonding tool is used to bond the second ends of the leads to the contacts.

The second row of leads 62 is aligned with the second row of contacts 36 on the chip 24a associated with region 52a. The leads 62 of the second row are straight and parallel to one another. Each lead 62 of the second row has a first end 72 attached to sheet 44 of the first element 20 and has a second end 74 attached to a contact 36 of the second row. Each lead 62 has a lead direction vector $V_{62}$ pointing from its first end 72 to its second end 74. The lead direction vectors $V_{62}$ point in the +X direction, transverse to the row direction of the associated row of contacts 36. The row of leads 62 as a whole extends in the Y directions, parallel to the second row of contacts 36. The second row of leads 62 is thus transverse to the first row of leads 60, and the lead direction vectors of the second row $V_{62}$ are transverse to the lead direction vectors $V_{60}$ of the first row.

The third row of straight, parallel leads 64, aligned with the third row of contacts 38 on the chip, is similar to the first row of leads 60; the lead direction vectors $V_{64}$ of the third row also point in the +Y direction, and hence point in the same direction as the lead direction vectors $V_{60}$ of the first row. However, the leads 64 in the third row have their first ends 65, attached to the first element or sheet, disposed in alignment with the inner region 42 of the chip front surface. Thus, the third row of leads 64 is referred to as a "interior row." By contrast, the first ends 68 of the first-row leads 60 are disposed outside of the inner region 42. Accordingly, the first row of leads 60 is referred to as a "exterior row." In the particular arrangement illustrated, the first ends 68 of exterior-row leads 60 also lie beyond the edge 32a adjacent the associated row of contacts 34.

The fourth row of leads 66, aligned with the fourth row of contacts 40 on the chip, is similar to second row 62, in that the lead direction vectors $V_{66}$ of the fourth-row leads point in the +X direction, i.e., in the same direction as vectors $V_{62}$ of the second row. The fourth row of leads is an interior row, such that the first ends 78 of the fourth row leads are aligned with the interior region 42 of the chip front surface, whereas the second row of leads is an exterior row, such that the first ends 72 of the second-row leads are disposed out of alignment with the interior region.

Although the second and fourth rows of leads 62 and 66 extend in different directions than the first and third rows 60 and 68, the lead direction vectors of all of the leads have components in a common direction C (FIGS. 1 and 3), oblique to the +X and +Y axes.

In the next stage of the process, the first element 20 and the second element 22 are moved relative to one another through a predetermined motion. For example, the sheet 44 of the first element may be temporarily held against a plate (not shown) by vacuum, by a temporary adhesive, or by a sacrificial layer which can be removed after the process, and this plate may be moved relative to the temporary support 26 holding chips 28 using any conventional mechanical, electromechanical, hydraulic or pneumatic mechanism capable of imparting the desired motion. Alternatively or additionally, where sheet 44 is held taut in a frame, the frame can be moved relative to the temporary support 26. In this predetermined motion, the elements move vertically away from one another, so that sheet 44 moves in the +Z direction relative to chips 28, and the elements move horizontally relative to one another. The horizontal motion of the first element relative to the second element is denoted by vector $M_{1,2}$ in FIG. 1. The horizontal motion vector $M_{1,2}$ has components in the +X and +Y directions, and hence has components codirectional with all of the lead direction vectors. The horizontal motion vector $M_{1,2}$ of the first element relative to the second element is oblique to all of the lead direction vectors. Most preferably, the horizontal motion vector $M_{1,2}$ is disposed at a 45° angle to the +X and +Y axes, and hence at the same angle to all of the lead direction vectors. Stated another way, the horizontal motion vector has a component in the common direction C of the lead direction vectors, and most preferably the horizontal motion vector $M_{1,2}$ is parallel to the common direction C of the lead direction vectors.

Figure 3:
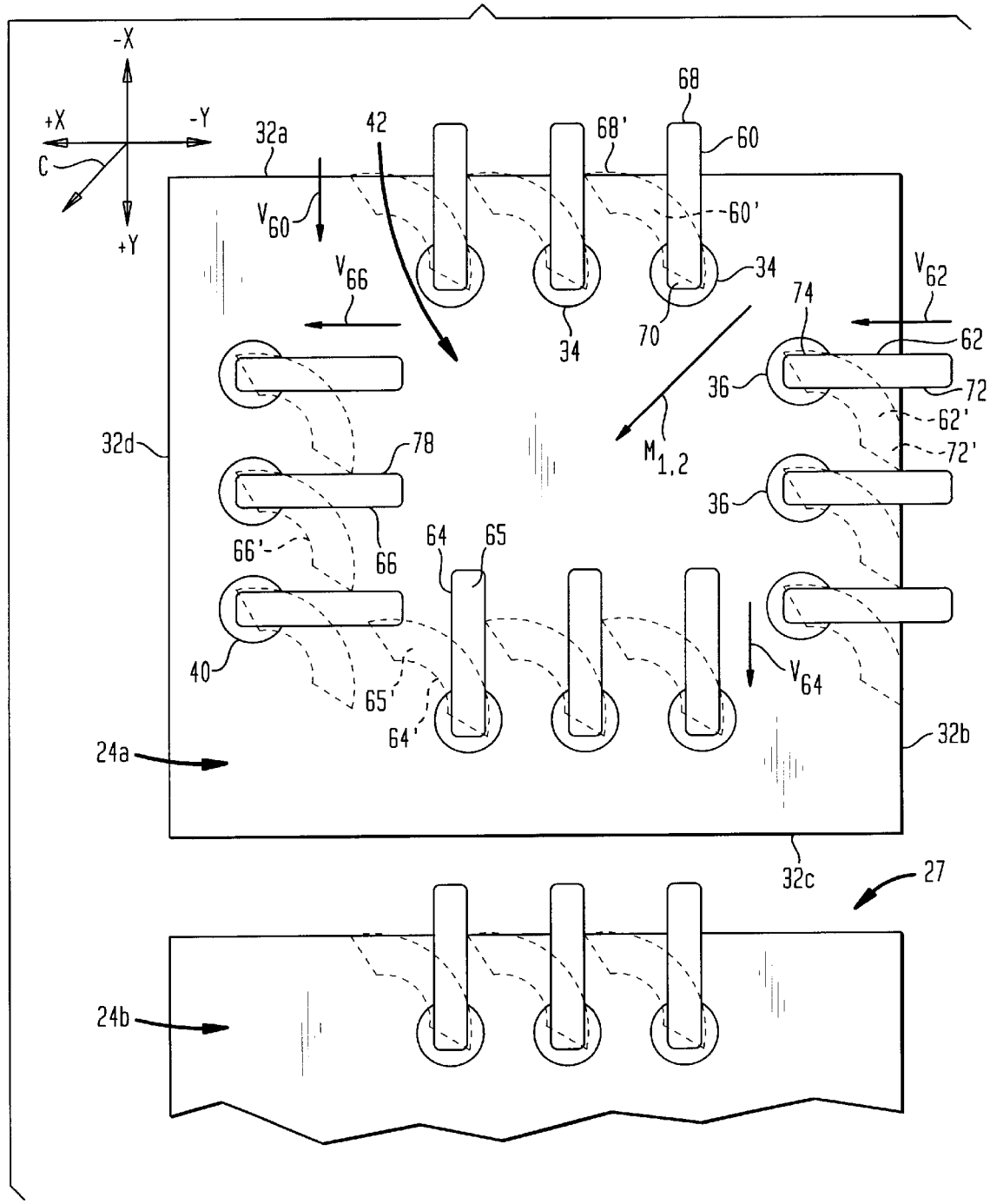
FIG. 3 is a diagrammatic plan view depicting certain parts of the elements of FIGS. 1–2.

As best seen in FIG. 3, the first end of each lead in the first row moves, from its original position 68 to the moved position 68' depicted in broken lines in FIG. 3. The horizontal component of motion along each lead direction vector moves the first end of each lead toward the second end of the same lead. For example, the first end 68 of each lead in the first row moves in the +Y direction toward the second end 70 the same lead. As best seen in FIG. 4, the combined effect of the vertical (+Z) motion and the horizontal movement component (+Y) codirectional with the lead direction vector $V_{60}$ is to bend each lead 60 of the first row into a vertically-extensive disposition, while providing some slack in the lead. At the same time, the horizontal movement component (+X) transverse to the lead direction vector bends each first-row lead 60 in the horizontal plane as shown in broken lines in FIG. 3. The same effects occur in the third row of leads 64, as the first ends of these leads move from their original positions 65 to the moved positions 65' shown in FIG. 3.

The leads 62 of the second row are also bent upwardly by the Z-direction or vertical movement. The first end of each lead 62 in the second row moves horizontally from its original position 72 to the moved position 72'. Thus, each first end 72 moves in the +X direction, codirectionally with the lead direction vectors $V_{62}$, toward the second end 74 of the same lead, so as to provide slack in these leads. The first ends 72 of the leads in the second row and also move in the +Y direction, laterally relative to the lead direction vectors, thereby bending the leads into the horizontally-curved shapes illustrated in broken lines in FIG. 3. The same effects occur in the leads 66 of the fourth row.

The horizontal movement of the elements also moves the first ends of the exterior rows inwardly, toward the interior region 42 of the associated chip, and toward the adjacent edges of the chip. Thus, as the first ends of the first-row leads move from their starting positions 68 to their moved positions 68', they move toward edge 32a of the associated chip 24a, and move across such edge so that in the moved positions 68', the first ends overlie chip 24a. Similarly, as the first ends of the second-row leads move from starting positions 72 to moved positions 72', they move inwardly toward edge 32b and across such edge, into alignment with chip 24a. The first ends 65 and 78 of the interior rows move outwardly, away from the interior region 42 and toward the edges of the chip, but desirably do not move beyond the edges of the chip. In this process, the regions 52 of sheet 44 associated with each chip are brought into alignment with the associated chip. Thus, region 52a is brought into alignment with chip 24a, and region 52b is brought into alignment with chip 24b. At the same time, the severance zones 54 of the sheet 44 of the first element are brought into alignment with the severance zones 27 between chips 24 of the second element.

As described in the '964 patent, a fluid may be introduced between the elements as, for example, between the chips and sheet 44 to form a layer surrounding the leads. For example, a compliant dielectric layer may be formed by injecting a gel, grease or elastomer, or a curable material adapted to form a gel, an elastomer or a foam upon curing. The bond windows 73 are covered by a solder mask or other sealing element prior to such injection, so that the fluid does not contact terminals 50. This injection step may be performed during or after the movement step. Where the injection step is performed during the movement step, the pressure of the injected material may help to impel the elements away from one another. However, the movement of the elements relative to one another preferably is constrained by means other than the leads 60, 62, 64 and 66, as by a mechanism such as that discussed above.

After movement and preferably after injection of the fluid, the first and second elements are severed along cutting planes 80 (FIG. 4) passing through the aligned severance zones 27 and 54 of the elements, so as to form individual units, each including one chip 24 and the associated region 52 of the dielectric sheet 44. Each such unit includes the leads 60, 62, 64 and 66 connected to the contacts of the chip and the terminals 50 or other conductive elements connected to such leads. Each unit forms a packaged semiconductor chip, which can be mounted to a substrate such as a circuit board or other element. For example, the terminals 50 of each element may be bonded to contact pads of the circuit board by solder or other electrically conductive bonding material.

The amount of slack provided in the leads should be enough to accommodate the relative movement of the lead ends, which will occur in service. For example, where the terminals 50 will be mounted to a substrate such as a printed circuit board, differential thermal expansion of the chip and substrate tends to move the first ends of the leads relative to the second ends. The slack in the leads desirably is equal to or greater than the amount of such movement expected during service. Merely by way of example, in some typical units, about 3–10 microns of slack are provided in each lead of the finished unit. Leads about 300–400 microns long, with horizontal movement of about 1 micron and vertical movement of about 6 microns, can be used.

The process discussed above provides the advantages achieved with the preferred processes disclosed in the '964 patent while allowing the use of straight leads even with chips having contacts disposed in rows extending along opposite edges of the chip, with chips having contacts disposed in rows extending in different directions, or both.

The same process can be used where one or more of the rows of leads and contacts are omitted. For example, a chip having only two rows of contacts on opposite edges, corresponding to the first row 34 and the third row 38 discussed above can be used. In such a process, the leads associated with both rows desirably have lead direction vectors pointing in the same direction. However, one row of leads is an interior row and the other row of leads is an exterior row. As discussed above with reference to leads 60 and 64 of the first and third rows, one row is an interior row and the other row is an exterior row. Before the elements are moved relative to one another, the first ends of the interior-row leads are aligned with the interior region of the chip, between the rows of contacts, whereas the first ends of the exterior-row leads lie outside of the interior region. Also, a chip having only two rows of contacts transverse to one another, such as the first row 34 and the second row 38 discussed above, can be used. In the processes discussed above, movement of the elements relative to one another brings each region 52 of sheet 44 into alignment with the chip. Therefore, each unit formed by severing the sheet and separating the chips may have the same horizontal dimensions as the chip included in such unit, or may have horizontal dimensions only slightly larger than the horizontal dimensions of the chip itself. However, it is not essential that the movement of the elements bring each region fully into alignment with the associated chip. Depending upon the amount of movement, the first ends 68 and 72 of the leads in exterior rows may protrude beyond the edges of the chip even after movement. This leaves a portion of each region 52 projecting beyond the edges of the chip, and forms units with slightly larger horizontal dimensions.

As shown in FIGS. 5 and 6, a process according to a further embodiment of the invention uses a unitary wafer 122 as the second element. Wafer 122 incorporates many semiconductor chips 124 disposed side-by-side, each such chip being bounded and separated from the neighboring chips by saw lanes 127 extending between the chips, so that the saw lanes define the edges of the individual chips. Although the chips and saw lanes are depicted with visible demarcations for clarity of illustration, in practice these demarcations are not visible in the actual wafer. Each chip incorporates the electronic components required in service. The saw lanes are devoid of components used in service, although they may contain components that are used in testing of the chips prior to the assembly process. Each chip is provided with leads connected to the components within the chip. In this embodiment, the leads are formed in place on the top surface 125 of the wafer. Processes for forming leads on the surface of a wafer are disclosed, for example, in co-pending, commonly assigned U.S. patent application Ser. No. 09/428,158, the disclosure of which is hereby incorporated by reference herein. Here again, the leads are arranged in rows. The leads associated with each chip include one row of leads 160 disposed adjacent one edge of the chip and a further row of leads 164 disposed adjacent the opposite edge of the chip. Here again, the leads within each row are parallel to one another and disposed side-by-side, so that the rows of leads extend transverse to the leads themselves, i.e., into and out of the plane of the drawing as seen in FIG. 5. The row of leads 164 is an interior row; the second ends 179 of these leads are connected to the chip associated chip 124, whereas the first ends 178 of these leads are disposed inboard of the second ends 179, and overlie the interior region 142 of the associated chip. The row of leads 160 is an exterior row; the second ends 170 of these leads are attached to the associated chip 124, whereas the first ends 168 of these leads extend outwardly, away from the interior region 142 of the associated chip and beyond the edges of the chip. Thus, the first ends 168a of leads 160a associated with chip 124a project over the saw lane 127a nearest to such leads and parallel to the row of leads 160a. In the particular embodiment illustrated, the exterior-row leads 160 extend entirely across the adjacent saw lanes, so that the first ends of the exterior-row leads on each chip 124 extend over the neighboring chip. For example, first ends 168a of leads 160a associated with chip 124a extend over chip 124b and overlie the second ends 179 of the interior-row leads on chip 124b. However, the overlying leads do not adhere to one another. The lead direction vectors $V_{160}$ of leads 160 (the vector from the first end of each lead to the second end of the same lead) point in the same direction as the lead direction vectors $V_{164}$ of leads 164.

A multiple-layer lead structure as shown in FIG. 5 can be formed, for example, by depositing a first sacrificial layer with openings where interior-row leads are to be formed; depositing a metal to form the interior-row leads 164; then depositing a second sacrificial layer over the first layer with openings where the exterior-row leads 160 are to be formed and depositing a metal in these openings to form leads 160. The first sacrificial layer may have vias where leads 160 are to be connected to the chip. A thin layer of a metal or other material which does not adhere strongly to the metals used to form the leads may be deposited over the second ends of the interior-row leads to prevent the first ends 168 of the exterior-row leads from bonding with the interior-row leads. The sacrificial layers may be removed. These steps may be performed using the high-resolution photolithography equipment commonly used to form features within the chips themselves, during manufacture of the wafer.

In the process according to this embodiment of the invention, the wafer or second element 122 is united with a first element 120 in the form of a dielectric sheet or plate 144 having numerous regions 152. Each region 152 includes the electrically-conductive elements that will be connected to one chip, such as terminals 150 and traces 151. Sheet or plate 144 also has severance zones 154 bounding regions 152 and separating neighboring regions from one another. Here again, the first element 120 overlies the second element or wafer 122, so that each region 152 is juxtaposed with a chip 124 to be associated with that region of the sheet or plate 144. The conductive elements of each region 152 are bonded and electrically connected to the first ends 168 and 178 of the leads associated with one chip 124 on the wafer. These bonds may be made by electrically conductive bonding materials carried on the first ends 168 and 178 of the leads, on the conductive elements 151 of the first element, or both.

After bonding, the first element and second element are moved vertically away from one another, so that first element 120 moves upwardly, in the +Z direction, relative to second element 122. The elements are also moved horizontally, so that the first element moves with a component of motion in the +X direction (to the left in FIGS. 5 and 6) relative to second element 122, and thus moves with a component of motion codirectional with lead direction vectors $V_{160}$ and $V_{164}$. In this embodiment as well, the horizontal motion brings each region 152 of first element 120 into alignment with the associated chip 124 of the second element or wafer, and brings the severance zones 154 of the first element into alignment with the saw lanes or severance zones 127 of the second element. The combined vertical and horizontal motion bends leads 160 and 164 into the vertically-extensive dispositions indicated at 160' and 164' in FIG. 6, and provides some slack in the bent leads. A fluid may be injected as described above between the elements to form a layer surrounding the leads. The elements may be severed along the aligned saw lanes 127 and severance zones 154, so as to form individual units each including a chip and the associated leads and conductive elements. Note that the combined vertical and horizontal motion displaces the exterior row leads 160 away from the saw lanes 127, so that the bent leads 160, no longer project over the saw lanes. The exterior-row leads 160' associated with each chip are separated from the interior-row leads 164' associated with the neighboring chip.

In a variant of the process discussed above with reference to FIGS. 5 and 6, each chip in the wafer is provided with one or more additional rows of leads extending transverse to the rows of leads 160 and 164. These additional rows of leads can be provided, for example, along edges of the chips perpendicular to the edges extending along rows 160 and 164. The leads in these rows have direction vectors in the +Y direction, i.e., transverse to, and typically perpendicular to the direction vectors V160 and V164, and out of the plane of the drawing as seen in FIG. 5. As discussed above, the horizontal movement of the first element 120 relative to the second element 122 includes components in the +X and +Y directions, so that the leads in all of the rows will be provided with slack by the horizontal movement.

In a further variant of the embodiment of FIGS. 5–6, the leads may be provided on both the first and second elements. The interior-row leads may be formed on the wafer, whereas the exterior-row leads may be carried on the sheet or plate 144 of the first element. When the elements are assembled to one another, the second ends of the exterior-row leads are bonded to contacts on the wafer, whereas the first ends of the interior-row leads are bonded to the conductive elements on the sheet or plate 144. After such bonding, the leads may have the same configuration as discussed above with reference to FIG. 5, with the first ends of the exterior-row leads overlying the second ends of interior-row leads on the adjacent chip. This avoids the need for making a dual-layer structure on the wafer.

Figure 7:
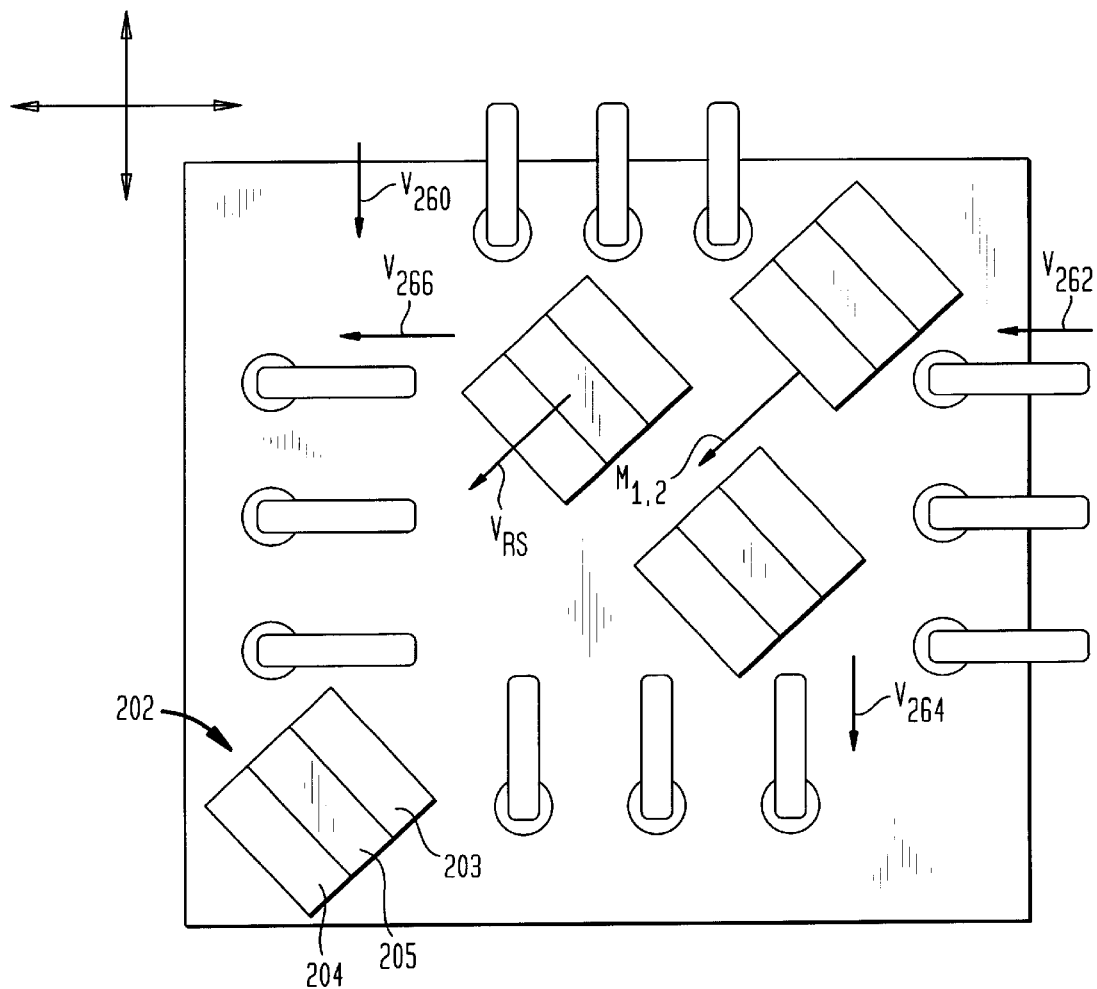
FIG. 7 is a diagrammatic plan view similar to FIG. 2 but depicting elements according to a further embodiment of the invention.
Figure 8:
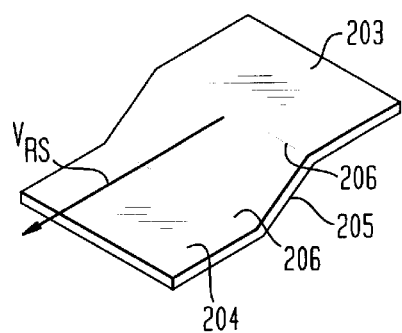
FIG. 8 is a diagrammatic perspective view of one part shown in FIG. 7, at a later stage of processing.

As disclosed in U.S. Pat. No. 5,976,913, the disclosure of which is hereby incorporated by reference herein, some of the leads in a particular assembly may be configured to serve as restraining straps to constrain the movement of the elements relative to one another. These restraining straps, can be shorter and stronger than the other leads in the assembly. As shown in FIG. 7, restraining straps 202 can be provided in the assembly used in the present invention. Each restraining strap 202 includes a first end 203 attached to the first element as, for example, to the dielectric sheet or plate, a second end 204 attached to the second element as, for example, to the chip or wafer, and an intermediate section 205 extending between these ends. The restraining straps may be provided on the first element and bonded to the second element during assembly, or vice-versa. The restraining straps, as initially provided in the assembly, are substantially flat. However, when the elements are moved vertically away from one another, each restraining strap will tend to bend into the configuration illustrated in FIG. 8, with the intermediate section extending upwardly. The restraining straps will limit the vertical movement of the elements, and also control the direction of horizontal movement. Each restraining strap will allow movement more readily in the horizontal direction from the first end 203 to the second end 204, i.e., along a restraining strap motion vector $V_{RS}$. All of the restraining straps are arranged so that their motion vectors $V_{RS}$ are parallel to one another and oblique to the lead direction vectors $V_{260}$, $V_{262}$, $V_{264}$ and $V_{266}$ of the other leads. Stated another way, the restraining strap motion vectors point in the direction of the desired horizontal motion $M_{1,2}$ of the first element relative to the second element. The configuration of the restraining straps can be selected to assure particularly precise control of the direction of horizontal movement. For example, each restraining strap may be relatively wide in directions transverse to the desired direction of the restraining strap motion vector, so that the strap resists bending of intermediate section 205 in horizontal directions transverse to such desired direction. Alternatively or additionally, each restraining strap may be provided with creases or thin sections 206 extending transverse to the desired direction of the restraining strap motion vector.

Figure 9:
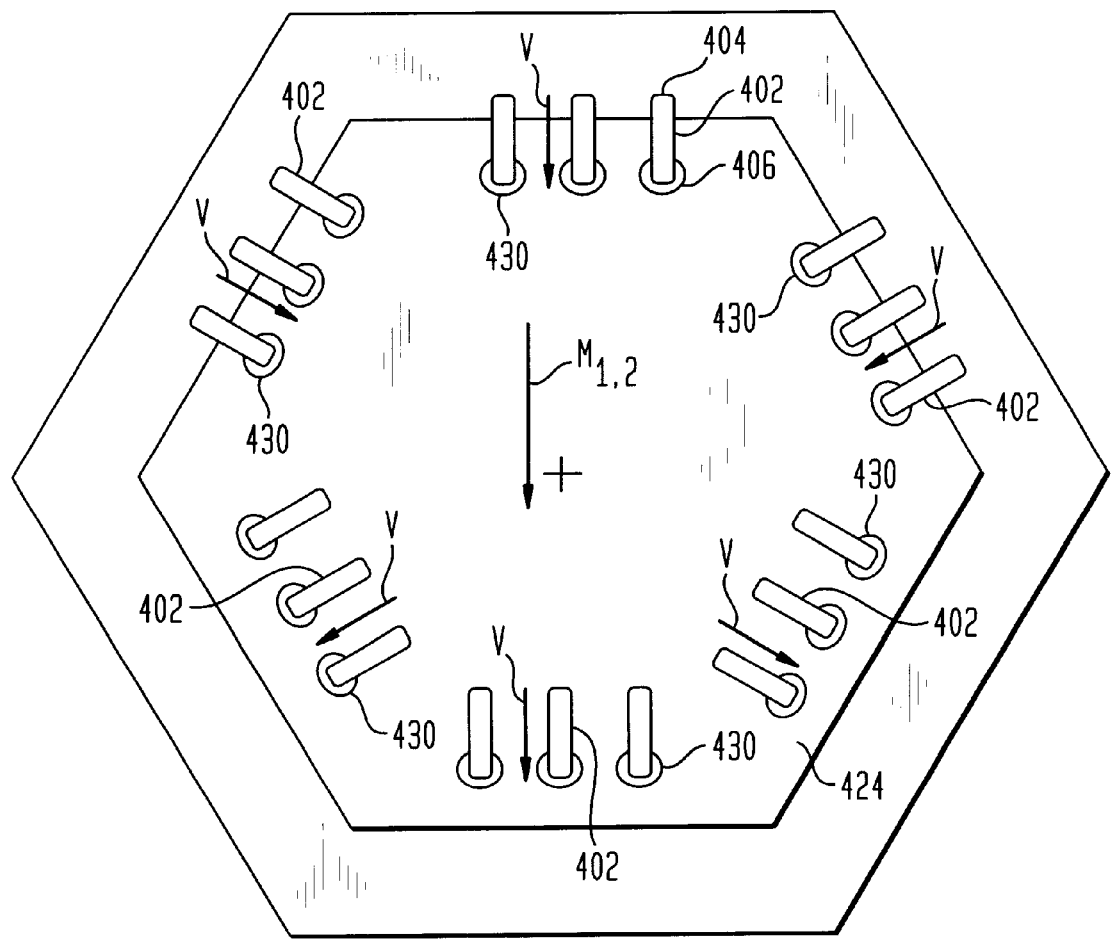
FIG. 9 is a diagrammatic plan view depicting elements in accordance with yet another embodiment of the invention.

It is not essential to provide the leads in rows that are perpendicular to one another. For example, an element such as a chip 424 (FIG. 9) may be generally hexagonal rather than rectangular, and may have contacts 430 disposed in rows extending at oblique angles to one another. The leads 402 are disposed in similar oblique rows. Here again, the lead direction vectors V of the various rows, from the first end 404 the second end 406 of each lead, extend in different directions, but all of the lead direction vectors have components in a common direction, i.e., the direction toward the bottom of the drawing in FIG. 9. The horizontal motion $M_{1,2}$ of the first element relative to the second element has a component in this common direction. Most preferably, the horizontal motion $M_{1,2}$ is entirely in this common direction.

The particular leads discussed above are straight prior to movement of the elements, and all of the leads within each row extend parallel to one another. However, it is not essential that all of the leads within each row, or the lead direction vectors of all of the leads within each row, extend parallel to one another. Some of the leads within a row may be oblique to other leads within the same row. Indeed, it is not essential that the leads be disposed in rows; the principles discussed above can be extended to any arrangement of leads including plural leads extending in different directions. Moreover, the invention also can be employed with leads that are initially curved. In the case of a curved lead 500 (FIG. 10), the lead direction vector $V_{500}$ should be take as the vector from the first end 502 to the second end 504, along the straight line connecting the two ends. Also, considering an element such as a dielectric element or a semiconductor chip or wafer prior to assembly with another element, where one end of the lead is permanently attached to the element and another end is releasably connected to the element or detached from the element, the end which is permanently attached should be considered as the first end whereas the other end should be considered as the second end.

Figure 11:
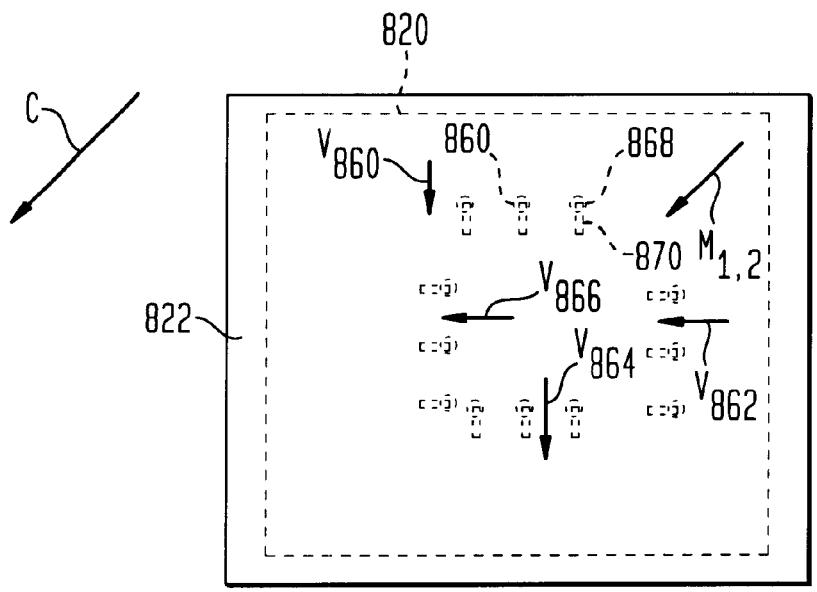
FIGS. 11 and 12 are diagrammatic plan views depicting elements used in two additional embodiments of the invention.

It is not essential that the leads and their connections to the second element be disposed adjacent edges of a semiconductor chip. For example, the same approach can be used where leads are connected to contacts near the center of a chip. As shown in FIG. 11, a first element 820 may be a semiconductor chip having a first row of leads 860 having first ends 868 permanently attached to contacts (not shown) on the chip and having second ends 870 releasably attached to the chip, so that the leads in this row define lead direction vectors $V_{860}$ pointing in one direction. The chip has other, similar leads defining lead direction vectors $V_{862}$ transverse to vectors $V_{860}$, and still other leads having additional lead direction vectors $V_{864}$ and $V_{866}$. All of these lead direction vectors have components in a common direction C. All of these leads are remote from the edges of the chip 820. A second element 822 such as a connection component is juxtaposed with chip 820 so that the second element overlies the first element. The first element or chip 820 is moved relative to the second element in a direction of motion $M_{1,2}$ aligned with the common direction C, and moved vertically away from the second element 822.

Figure 12:
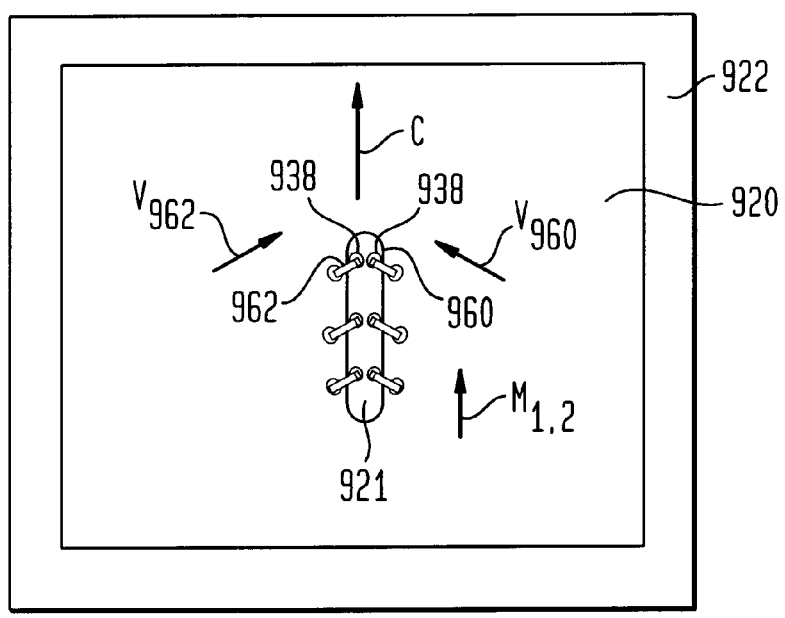

As shown in FIG. 12, a connection component 920 having a hole 921 near its center may serve as one element. In the particular embodiment illustrated, only two rows of leads 960 and 962 are provided on the connection component. The first ends of the leads are permanently attached to the connection component, whereas the second ends of the leads project across the boundary of hole 921. These rows extend generally parallel to one another, but the lead direction vectors $V_{960}$ of the leads 960 in one row are transverse to the lead direction vectors $V_{962}$ in the other row. In the particular arrangement illustrated in FIG. 16, the leads are arranged in a herringbone pattern. The lead direction vectors have components in a common direction C, corresponding to the central axis of the herringbone pattern. The connection component is juxtaposed with a chip 922 having contacts 938 disposed adjacent its center, and the hole is aligned with the contacts. After bonding the second ends of the leads to the contacts on the chip, the connection component or first element 920 is moved vertically away from the chip 922 so as to bend the leads and horizontally in a direction of movement $M_{1,2}$ codirectional with the common direction C so as to provide slack in the leads. Such an arrangement can be used, for example, to make connections with chips having one or more central rows of contacts.

Figure 10:
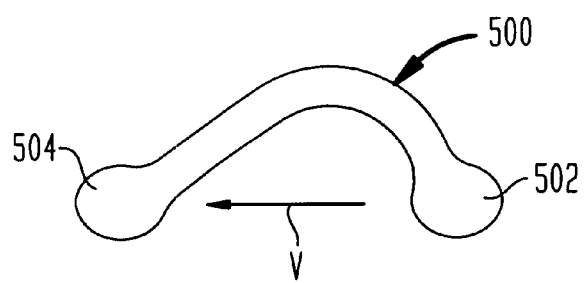
FIG. 10 is a diagrammatic plan view of a lead used in a further embodiment of the invention.
Figure 13:
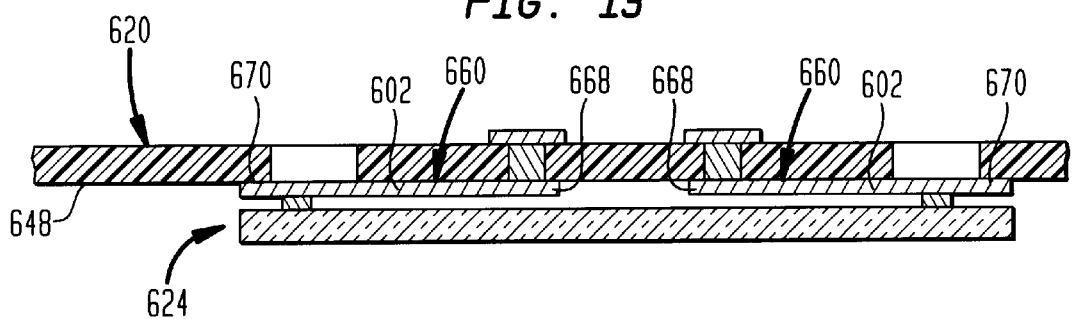
FIG. 13 is a diagrammatic sectional view depicting elements during one stage of a process in accordance with a further embodiment of the invention.

A process according to a further embodiment of the invention utilizes a first element or connection component 620 (FIG. 13) that has leads 660 having first ends 668 permanently attached to the connection component and second ends 670 which are releasably attached to the connection component. Each lead extends along the bottom surface 648 of the connection component, and has an attachment region 602 between its first and second ends releasably attached to the connection component. Here again, the leads are provided in rows, with the leads within each row desirably extending parallel to one another. Most preferably, the individual leads, in their initial, undeformed condition, are curved to some extent, for example as illustrated in FIG. 10. The lead direction vectors V of the leads in different rows are not codirectional. Thus, leads of one row have direction vectors $V_A$ pointing to the left, in the +X direction, whereas the leads of the opposite row have direction vectors $V_B$ pointing to the right, in the −X direction. This connection component is juxtaposed with a second element such as a semiconductor chip 624, so that the region of component 620 bearing the leads overlies the chip. The second ends of the leads are bonded to the second element as discussed above.

Figure 14:
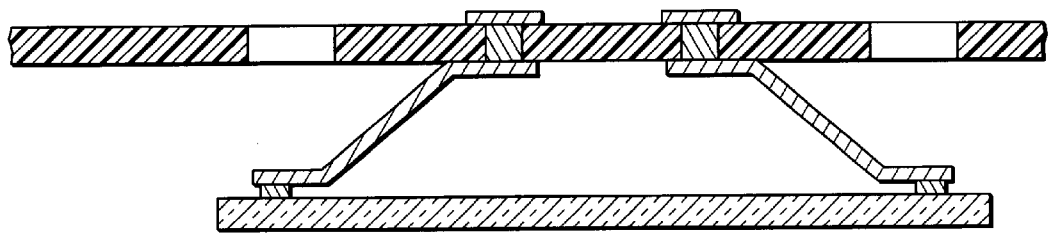
FIGS. 14 and 15 are views similar to FIG. 13, depicting the elements of FIG. 13 during later stages of the process.

In the next stage of the process, the elements are moved vertically away from one another through a predetermined first displacement, desirably without horizontal movement. Thus, the first element moves in the +Z direction relative to the second element. Here again, the relative movement of the first and second elements may be constrained by mechanisms as discussed above (not shown), by restraining straps (not shown) included in the assembly, or both. As the elements move vertically away from one another, some parts of the attachment regions 602 of the leads are peeled away from the connection component 620 and are bent to vertically-extensive dispositions. In the stage of the process depicted in FIG. 14, the elements have been moved through the full first displacement, and a substantial portion of each attachment region has been peeled away and bent. The vertical displacement moves the first end of each lead away from the second end of the lead, thereby straightening the leads so that at the conclusion of this step the leads are taut.

Figure 15:
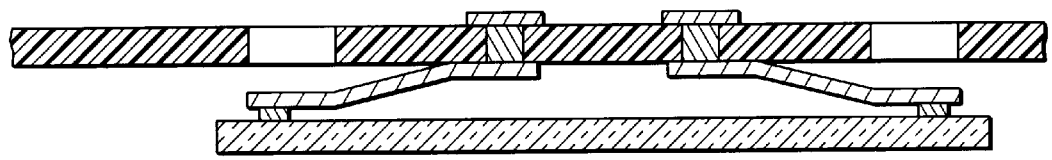

In the next stage of the process, the first and second elements are moved towards one another through a second predetermined displacement, of smaller magnitude than the first predetermined displacement. Thus, the first element 620 moves in the −Z direction, toward the second element 624, but the first element does not return all the way to its starting position. This second displacement brings the elements to the positions depicted in FIG. 15. In this condition, the leads are slack. Stated another way, the second displacement adds slack to the completed leads. This reduces the curvature that must be provided initially in the leads to yield a given degree of slack in the completed leads. This makes it easier to provide leads in closely-packed arrangements on a surface of an element, or on both elements.

Processes as described above with reference to FIGS. 13–15 can be used with leads disposed in essentially any orientation, and can also be used with leads which are initially straight. Where the leads are initially straight, the vertical in the first displacement may be accompanied by some horizontal movement in a direction which will move the first ends of the leads toward the second ends, but which will still leave the leads taut at the conclusion of this step. To permit this, the leads may have direction vectors which are point in the same direction or which have components in a common direction as discussed above. In general, the amount of slack that can be provided in the leads depends on the magnitude of the first and second displacements. In one example, to provide 10 microns of slack in the leads, the first displacement may be on the order of 150 microns, leaving the leads taut at the conclusion of the first displacement, and the second displacement may be on the order of 50 microns. The magnitude of the first displacement in turn is limited by the configuration of the leads and the length of the peelable attachment sections in the leads. In the same example, the peelable attachment sections may be about 420–430 microns long.

In a variant of this process, the leads are initially carried on the second element, i.e., on the top surface of the wafer.

The leads depicted in FIGS. 1–15 are simple, unitary leads consisting of a single conductor. However, the same processes can be performed using leads having additional features. For example, as described in greater detail in commonly assigned International Publications WO 97/11588 and WO 98/44564, disclosures of which are hereby incorporated by reference herein, the leads used to connect elements such as semiconductor chips to other elements such as connection components may be multiconductor leads, each incorporating plural conductors separated from one another by a dielectric. The conductors of a dual conductor lead may be used either to carry a fixed potential and a signal or to carry two signal potentials, such as two opposite-polarity signals. As also described in these publications, a multiconductor lead may include three or more conductors. Such multiconductor leads may be used in processes according to the present invention.

As described in certain preferred embodiments of co-pending, commonly assigned U.S. patent application Ser. No. 09/267,058 filed Mar. 12, 1999 and the corresponding U.S. Pat. No. 6,117,694 and in U.S. patent application Ser. No. 09/317,675, filed May 24, 1999, the disclosures of which are also incorporated by reference herein, a connection component may be provided as a sheet of a dielectric material with a main region and with lead regions defined by slots extending through the sheet. Such slots extend partially around each such lead region. For example, where the lead regions are elongated strips, the slots may be formed as an elongated "U" with the base of the "U" disposed at a tip end of the lead and with the open end of the "U" disposed at a fixed end of the lead region. Thus, the lead region remains connected to the main region at the fixed end or open end of the U-shaped slot. Typically, the sheet is positioned on a temporary support before the slots are formed. Each lead region includes one or more electrically conductive strips connected to terminals exposed at a top surface of the main region. After the slots have been formed, the support, with the component therein, is engaged with a microelectronic element such as a chip or wafer so that bottom surface of the sheet faces toward the microelectronic element. Each lead region forms one lead having a first end permanently attached to the remainder of the connection component and having a second end releasably attached to the connection component by the temporary support. The second ends of the leads, (the tip ends of the lead regions) are bonded to contacts on the chip so as to electrically connect the contacts of the chip to the strips in the lead regions. After bonding, the temporary support is detached at least from the lead regions, so that the main region of the sheet can be moved away from the chip or wafer to bend the leads. Components and leads of this type can be employed in the present invention. Processes for forming similar leads on the surface of a chip or other microelectronic element are disclosed in certain preferred embodiments of co-pending, commonly assigned U.S. Provisional Patent Application 60/204,735 of Belgacem Haba entitled Microelectronic Packaging Methods and Components, filed May 16, 2000, the disclosure of which is hereby incorporated by reference herein.

Figure 16:
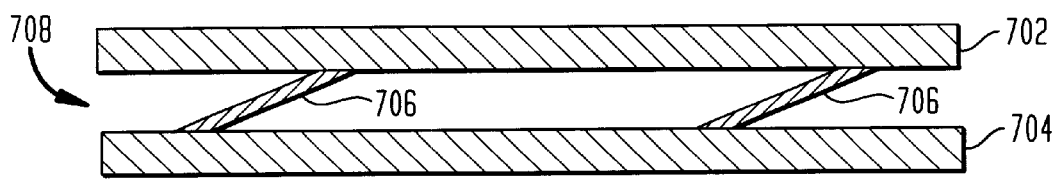
FIGS. 16 and 17 are diagrammatic sectional views depicting elements used in a process according to a further embodiment of the invention, during successive stages of such process.
Figure 17:
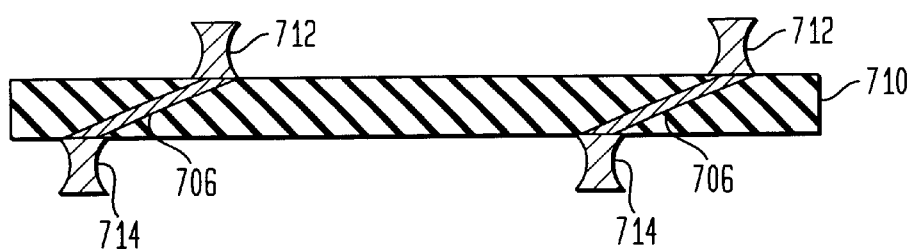

The processes discussed above can be used to form connectors that can be interposed between other microelectronic elements. Thus, as used in this disclosure, the term "microelectronic unit" should be understood broadly as including both an assembly of plural microelectronic elements such as an active semiconductor chip and a connection component, and a connector that can be united later with other microelectronic elements. For example, certain embodiments of the aforementioned '964 patent disclose processes for forming connectors by providing two sheetlike elements overlying one another so that each sheetlike element has an inner surface facing toward the other element and an outer surface facing away from the other element. Each such sheetlike element has terminals accessible from the outer surface. Leads extending between the inner surfaces of the sheetlike elements and electrically connected to the terminals are deformed by moving the sheetlike elements away from one another. A material, typically a compliant dielectric material such as a gel or an elastomer, is introduced between the sheetlike elements during or after such movement so as to form a dielectric layer between the sheetlike elements. The present invention can be applied in the same manner to form connectors. Also, as disclosed in certain embodiments of U.S. Pat. No. 5,989,936, the disclosure of which is hereby incorporated by reference herein, an element used in a process as taught in the '964 patent may include a sheet of a conductive material such as a metal. This sheet is connected to another element by leads, and the elements are moved away from one another to deform the leads. Typically, a dielectric material is introduced during or after such movement to form a dielectric layer surrounding the leads. After such movement, the conductive sheet is etched so as to form terminals connected to the leads. This process can be used in present invention as well. Thus, one or both of the elements to which the leads are connected may include or consist of such a conductive sheet. For example, as shown in FIGS. 16 and 17, a connector can be formed by providing a pair of metallic sheets 702 and 704 as first and second elements with leads extending therebetween, each such lead having a first end connected to sheet 702 and a second end connected to sheet 704. The leads may be arranged as discussed above. Preferably, each lead has a direction vector from its first end to its second end, at least some of said direction vectors being non-parallel to others of said direction vectors, the direction vectors having components in a common horizontal direction. The leads may be deformed to a vertically-bent configuration shown in FIG. 16 by moving the sheets vertically away from one another and horizontally relative to one another so that the first element moves in with a horizontal component of motion in the common horizontal direction, thereby moving the first ends of the leads horizontally toward the second ends of the leads so as to provide some slack in the leads. The bent leads 706 are represented in FIGS. 16 and 17 as simple straight bodies for simplicity, but in practice the leads are bent into curved configurations during the movement step. Alternatively, a process as described above with reference to FIGS. 13–15 can be used to bring the leads and sheets to the configuration of FIG. 16. During or after the movement step, a dielectric material such as a compliant dielectric gel or elastomer is introduced into the space 708 between the sheets and cured to form a dielectric layer 710 (FIG. 17) surrounding the leads. The sheets are then etched to form terminals 712 at the first ends of the lead and terminals 714 at the second ends of the leads.

Additional variations and improvements of the process taught in the '964 patent are disclosed in commonly assigned U.S. Pat. Nos. 5,798,286, 5,830,782, 5,688,716, and 5,913,109 and in co-pending, commonly assigned U.S. patent application Ser. No. 09/271,688, filed Mar. 18, 1999. The disclosures of all of the aforesaid patents and applications are hereby incorporated by reference herein.

In the processes described above, the horizontal movement of the first element relative to the second element provides additional slack in all of the leads. Stated another way, the horizontal movement vector $M_{1,2}$ of the first element with respect to the second element has a component codirectional with the lead direction vector of every lead in the assembly. In the embodiment of FIGS. 1–5, the movement vector is directed at about a 45° angle with respect to the lead direction vector of every lead in the assembly, so that the component codirectional with every lead direction vector is of equal magnitude. However, this is not essential. The motion vector may be directed at unequal angles to different lead direction vectors. For example, in the embodiment of FIG. 9, the horizontal motion vector $M_{1,2}$ is parallel or nearly parallel to the lead direction vectors of the leads in the top and bottom rows, but lies at an angle of about 60° to the lead direction vectors of the leads in other rows, so that the horizontal movement provides less slack to these leads. The design of the leads can be selected to match the amount of slack provided. For example, initially-curved leads may be provided at those locations where the horizontal movement provides less slack. In still other embodiments, the unit may include additional conductors connected between the elements but arranged so that the horizontal movement tends to pull the conductors taut rather than make them slack. That is, such additional conductors may have direction vectors counterdirectional to the horizontal motion vector. Such additional conductors should include other means for providing slack. For example, the additional conductors should be highly curved prior to deformation.

AS these and other variations and combinations of the features disclosed above can be utilized without departing from the present invention, the foregoing description of the preferred embodiments should be taken by way of illustration rather than by way of limitation of the invention.

What is claimed is:

1. A method of making a microelectronic unit comprising the steps of:
    (a) providing first and second elements and leads extending between said elements, each said lead having a first end connected to the first element and a second end connected to the second element, each said lead having a direction vector from its first end to its second end, at least some of said direction vectors being non-parallel to others of said direction vectors, said direction vectors having components in a common horizontal direction; and
    (b) moving said first and second elements so that said first element moves through a displacement relative to said second element with a vertical component of motion away from said second element and with a horizontal component of motion in said common horizontal direction, whereby the horizontal component of motion will move the first end of each lead toward the second end of such lead and the vertical component of motion will move the first end of each lead away from the second end of such lead.

2. A method as claimed in claim 1, wherein, prior to said moving step, said leads are disposed in rows, the leads within each row being substantially parallel to one another.

3. A method as claimed in claim 2, wherein said leads, prior to said moving step, are substantially straight.

4. A method of making a microelectronic unit comprising the steps of:
    (a) providing a first element and a second element and leads connected between said first and second elements, said leads being disposed in rows extending in row directions, at least some of the leads within each row being substantially parallel to one another and extending transverse to the row direction of that row, at least one of said row directions being transverse to other ones of said row directions, said leads having first ends attached to said first element and second ends attached to said second element,
    (b) moving said first and second elements so that said first element moves through a displacement relative to said second element vertically away from said second element and horizontally oblique to said row directions such that the horizontal motion moves the first end of each lead toward the second end of such lead.

5. A method as claimed in claim 4, wherein all of the leads in each said row are parallel to one another prior to said moving step.

6. A method as claimed in claim 5, wherein all of the leads in each said row are substantially straight prior to said moving step.

7. A method as claimed in claim 4, wherein said rows include a first row extending in X horizontal directions and a second row extending in Y horizontal directions, said leads having direction vectors from their first ends to their second ends, the direction vectors of leads in said first row having components in the +Y direction, the direction vectors of the leads in said second row having direction vectors in the +X direction, the horizontal motion of said first element relative to said second element having components in the +X and +Y directions.

8. A method as claimed in claim 7, wherein said rows include a third row extending in said X directions, the direction vectors of leads in said third row having components in said +Y direction.

9. A method as claimed in claim 8, wherein said rows include a fourth row extending in said Y horizontal directions, the direction vectors of leads in said fourth row having components in the +X direction.

10. A method as claimed in claim any of claims 4–7 wherein said second element includes a semiconductor chip having rows of contacts and said first element includes a connection component.

11. A method as claimed in claim 10, wherein said connection component has said leads preformed thereon, said providing step including juxtaposing the connection component having said preformed leads thereon with the chip so that said rows of leads are aligned with said rows of contacts and bonding the second ends of the leads to the contacts on the chip.

12. A method of making a semiconductor chip assembly including the steps of:
   (a) providing (i) a first element; (ii) a second element including a semiconductor chip having a front surface with edges, one row of contacts extending generally in +X and −X directions along one edge, another row of contacts extending generally in said +X and −X directions along another edge, and an inner region between said first and second rows of contacts; and (iii) leads having first ends connected to said first component and having second ends connected to the contacts on said chip, said leads being disposed in rows including one row aligned with one row of contacts and another row aligned with another row of contacts, each said lead having a lead direction vector extending from its first end to its second end, the lead direction vectors having components in a +Y direction perpendicular to said +X and −X directions; and
   (b) moving said first and second elements through a displacement so that said first element moves vertically away from said second element and said first element moves horizontally relative to said first element with a component of motion in said +Y direction.

13. A method as claimed in claim 12, wherein, prior to said moving step, said first ends of said leads in said one row are disposed over said inner region of said front surface whereas said first ends of said leads in said another row are disposed out of alignment with said inner region.

14. A method of making a semiconductor chip assembly including the steps of:
   (a) providing (i) a first element; (ii) a second element including a semiconductor chip having a front surface with edges, and plural rows of contacts bounding an inner region of said front surface on at least two sides of such inner region; and (iii) leads having first ends connected to said first component and having second ends connected to the contacts on said chip, said leads being disposed in rows including rows aligned with the rows of contacts, each said lead extending generally transverse to the row of leads including such row and generally transverse to the row of contacts aligned with such row of leads, said rows of leads including interior and exterior rows, the first ends of the leads in said interior rows being aligned with the inner region of the chip front surface, the first ends of the leads in the exterior rows being out of alignment with the inner region,
   (b) moving said first and second elements relative to one another through a displacement so that said first element moves vertically away from said second element and said second element moves horizontally relative to said first element, the horizontal motion displacing the first end of each lead in the exterior rows inwardly, toward the inner region and displacing the first ends of the leads in the interior rows outwardly.

15. A method as claimed in claim 14, wherein, after said moving step, the first ends of all of said leads are disposed in alignment with said chip.

16. A method of making a plurality of microelectronic assemblies including the steps of:
   (a) providing a first element, a second element including a plurality of semiconductor chips disposed side-by-side and separated from one another by severance zones so that each severance zone defines edges of adjacent chips disposed on opposite sides of such severance lane, and leads disposed in rows associated with each chip, the leads in each said row having a first end connected to the first element and a second end connected to the chip associated with such row, the rows of leads associated with at least some of said chips including interior rows and exterior rows, the first ends of the leads in each interior row being disposed in alignment with the associated chip, the first ends of the leads in each exterior row projecting outwardly from the associated chip at least partially across a severance lane bordering the chip;
   (b) moving said first and second elements through a displacement so that said first and second elements move vertically away from one another and move horizontally relative to one another, the horizontal movement displacing the first ends of the leads in each exterior row into alignment with the associated chip while leaving the first ends of the leads in each interior row in alignment with the associated chip, whereby said leads do not project across said severance zones after said moving step and second elements being aligned with one another in said moving step.

17. A method as claimed in claim 16, wherein said second element includes a unitary wafer incorporating said chips.

18. A method as claimed in claim 17, wherein, prior to said moving step, the first ends of the leads in exterior rows associated with at least some of said chips overlie leads in interior rows associated with others of said chips.

19. A method as claimed in claim 16, wherein said second ends of said leads are connected to rows of contacts disposed adjacent the edges of each chip, said rows of contacts extending substantially parallel to and adjacent the edges of each chip.

20. A method as claimed in claim 16 further comprising separating said chips after said moving step from one another at said severance zones so as to form units, each said unit including one said chip and the leads associated therewith.

21. A method as claimed in claim 20, wherein said first element includes a plurality of connection components, each said connection component being associated with one of said chips, the first ends of the leads associated with each chip being attached to the connection component associated with that chip, each said unit including one said chip and the connection component associated with that chip.

22. A method as claimed in claim 21, wherein said first element includes a unitary sheet incorporating said plurality of connection components and severance zones extending between neighboring connection components, the severance zones of said first element being out of alignment with the severance zones of said second element prior to said moving step, said severance zones of said first and second elements being aligned with one another in said moving step.

23. A method as claimed in claim 22, wherein said step of separating said chips from one another is performed by simultaneously severing said first and second elements along said aligned severance zones.

24. A method of making a microelectronic unit including the steps of:
   (a) providing a first element, a second element and leads having first ends connected to the first element and second ends connected to the second element, the leads having attachment regions between their first and second ends, attachment regions of the leads extending along a surface of the first element;
   (b) moving said first and second elements relative to one another so that said first element moves vertically away from said second element through a first displacement in a +Z direction, said attachment regions of said leads being at least partially detached from said first element during such movement; and then
   (c) moving said first and second elements relative to one another so that said first element moves vertically toward said second element through a second displacement in a −Z direction so at to provide slack in said leads.

25. A method as claimed in claim 24, wherein said second displacement is less than said first displacement.

26. A method as claimed in claim 25, wherein said leads are curved prior to movement through said first displacement.

27. A method as claimed in claim 25, wherein said second element includes at least one semiconductor chip having contacts and said second ends of said leads are connected to said contacts in said providing step.

28. A method as claimed in claim 27, wherein said second element includes a plurality of semiconductor chips disposed side-by-side and separated from one another by severance zones so that each severance lane defines edges of adjacent chips disposed on opposite sides of such severance zones.

29. A method as claimed in claim 27 or claim 28, wherein the contacts of each chip are disposed in rows adjacent edges of that chip.

30. An article for use in making microelectronic assemblies comprising:
   (a) a dielectric element having a bottom surface;
   (b) leads extending over the bottom surface of the dielectric element, said leads having first ends permanently connected to the dielectric element, second ends releasably connected to the dielectric element, each said lead having a lead direction vector from its first end to its second end, the lead direction vectors of at least some of said leads extending in different directions, the lead direction vectors of all of said leads having components in a common direction.

31. An article comprising:
   (a) a microelectronic element including at least one semiconductor chip, said element having a top surface;
   (b) leads extending over the top surface of the microelectronic element, said leads having first ends releasably connected to the microelectronic element and second ends permanently connected to the microelectronic element, each said lead having a lead direction vector from its first end to its second end, the lead direction vectors of at least some of said leads extending in different directions, the lead direction vectors of all of said leads having components in a common direction.

32. A article as claimed in claim 30 or claim 31, wherein said leads are arranged in rows, the leads of each said row extending side-by-side.

33. A article as claimed in claim 32, wherein at least some of the leads within each said row are straight and parallel to one another.

34. An article as claimed in claim 33, wherein all of the leads within each said row are straight and parallel to one another.

35. A article as claimed in claim 32, wherein said rows include a first row and a second row extending substantially perpendicular to the first row.

36. A article as claimed in claim 35, wherein said rows include a third row substantially parallel to the first row but spaced apart from the third row, the lead direction vectors of the leads in the third row being substantially codirectional with the lead direction vectors of the leads in the first row.

37. A article as claimed in claim 36, wherein said rows include a fourth row substantially parallel to the second row but spaced apart from the second row, the lead direction vectors of the leads in the fourth row being substantially codirectional with the lead direction vectors of the leads in the second row.

38. An article as claimed in claim 31, wherein said microelectronic element includes a plurality of semiconductor chips disposed side-by-side, each said semiconductor chip having leads as aforesaid.

39. An article as claimed in claim 38, wherein said microelectronic element is a unitary semiconductor wafer.

40. An article as claimed in claim 30, wherein said dielectric element is a unitary sheet or plate incorporating a plurality of regions, each adapted for connection to a semiconductor chip, each said region having leads as aforesaid.

* * * * *

UNITED STATES PATENT AND TRADEMARK OFFICE
CERTIFICATE OF CORRECTION

PATENT NO.    : 6,657,286 B2
DATED         : December 2, 2003
INVENTOR(S)   : David Light It is certified that error appears in the above-identified patent and that said Letters Patent is hereby corrected as shown below:

<u>Title page</u>,
Item [57], ABSTRACT, delete the "." after the word "element."

<u>Column 1</u>,
Line 50, "scriatim" should be -- seriatim --.

<u>Column 2</u>,
Line 61, after the word "step" insert -- of --.

<u>Column 4</u>,
Line 61, after the word "used" insert -- in --.

<u>Column 7</u>,
Line 48, "a" should be -- an --.

<u>Column 18</u>,
Line 1, "AS" should be -- As --.

<u>Column 19</u>,
Line 7, after the word "in" delete the word -- claim --.

<u>Column 20</u>,
Lines 35-36, delete the phrase "and second elements being aligned with one another in said moving step".

<u>Column 22</u>,
Lines 17, 20, 26, 29 and 34, "A article" should be -- An article --.

Signed and Sealed this

Third Day of February, 2004

JON W. DUDAS
*Acting Director of the United States Patent and Trademark Office*